United States Patent
Jang

(10) Patent No.: US 7,741,211 B2
(45) Date of Patent: Jun. 22, 2010

(54) METHOD FOR MANUFACTURING A SEMICONDUCTOR DEVICE

(75) Inventor: Jeong Yel Jang, Soowon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 301 days.

(21) Appl. No.: 11/777,101

(22) Filed: Jul. 12, 2007

(65) Prior Publication Data

US 2008/0012145 A1 Jan. 17, 2008

(30) Foreign Application Priority Data

Jul. 12, 2006 (KR) .................. 10-2006-0065591

(51) Int. Cl.
*H01L 21/4763* (2006.01)
(52) U.S. Cl. ................ 438/619; 257/E21.573; 257/E21.581
(58) Field of Classification Search ........... 438/619; 257/E21.573, E21.581
See application file for complete search history.

(56) References Cited

U.S. PATENT DOCUMENTS

| 6,184,121 | B1 * | 2/2001 | Buchwalter et al. ......... 438/622 |
| 6,268,277 | B1 * | 7/2001 | Bang ......................... 438/619 |
| 7,235,493 | B2 * | 6/2007 | Qin ............................ 438/739 |

FOREIGN PATENT DOCUMENTS

JP 2003-115534 4/2003

\* cited by examiner

*Primary Examiner*—Jerome Jackson, Jr.
*Assistant Examiner*—Paul A Budd
(74) *Attorney, Agent, or Firm*—Saliwanchik, Lloyd & Saliwanchik

(57) ABSTRACT

A semiconductor device can include a first interlayer dielectric layer disposed on a substrate, and an air gap defined in a portion of the first interlayer dielectric layer. The air gap can be formed within trenches etched into the first interlayer dielectric layer. An etch stop layer is disposed on the first interlayer dielectric layer and the air gap, and includes a hole communicating with the air gap.

9 Claims, 5 Drawing Sheets

METHOD FOR MANUFACTURING A SEMICONDUCTOR DEVICE

CROSS-REFERENCE TO RELATED APPLICATION

The present application claims the benefit under 35 U.S.C. §119 of Korean Patent Application No. 10-2006-065591, filed Jul. 12, 2006, which is hereby incorporated by reference in its entirety.

BACKGROUND

As semiconductor devices become highly integrated, a gap between adjacent metal lines decreases. Meanwhile, due to high dielectric constant (k) of an insulating material used for insulating adjacent metal lines, a capacitance between the adjacent metal lines increases and an RC delay occurs, leading to degradation of device characteristics.

As semiconductor devices are scaled down, interlayer dielectric (ILD) layers for isolating adjacent metal layers become thinner, which causes interference between a top metal layer and a bottom metal layer. In addition, when a dielectric constant of the ILD layer is high, a capacitor is naturally formed between the ILD layer and the top/bottom metal layers.

In recent years, studies have been conducted on novel materials and methods for manufacturing semiconductor devices using the same in order to reduce the dielectric constant of the ILD layer interposed between the metal layers.

BRIEF SUMMARY

Embodiments provide semiconductor devices having a low dielectric constant compared with the related art.

Embodiments also provide semiconductor devices including an ILD layer with a low dielectric constant, in which the ILD layer is stable in structure in spite of air gaps.

In one embodiment, a semiconductor device includes: a first interlayer dielectric layer on a substrate; an air gap in a portion of the first interlayer dielectric layer; and an etch stop layer on the first interlayer dielectric layer and the air gap, the etch stop layer including a hole communicating with the air gap.

In another embodiment, a method for manufacturing a semiconductor device includes: forming a first interlayer dielectric layer on a substrate including at least one trench; forming an etch stop layer on the first interlayer dielectric layer; selectively etching the etch stop layer to form a plurality of vias; and forming an air gap in the first interlayer dielectric layer.

The details of one or more embodiments are set forth in the accompanying drawings and the description below. Other features will be apparent from the description and drawings, and from the claims.

DETAILED DESCRIPTION

Embodiments of a semiconductor device and a method for manufacturing the same will be described below in detail with reference to the accompanying drawings.

In the description of embodiments, it will be understood that when a layer (or film) is referred to as being 'on' another layer or substrate, it can be directly on the another layer or substrate, or intervening layers may also be present. Further, it will be understood that when a layer is referred to as being 'under' another layer, it can be directly under the another layer, and one or more intervening layers may also be present. In addition, it will also be understood that when a layer is referred to as being 'between' two layers, it can be the only layer between the two layers, or one or more intervening layers may also be present.

Figure 1:
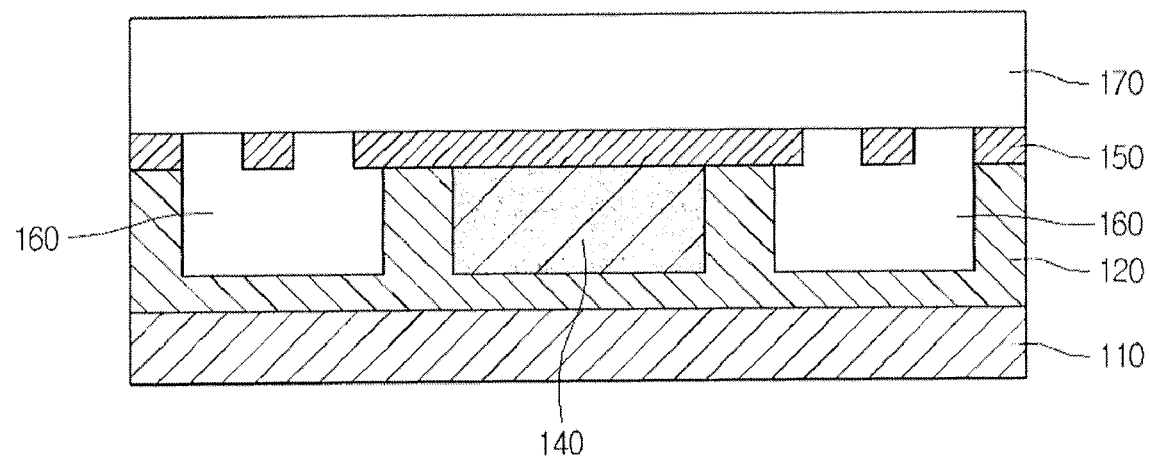
FIG. 1 is a cross-sectional view illustrating an embodiment of a semiconductor device.
Figure 11:
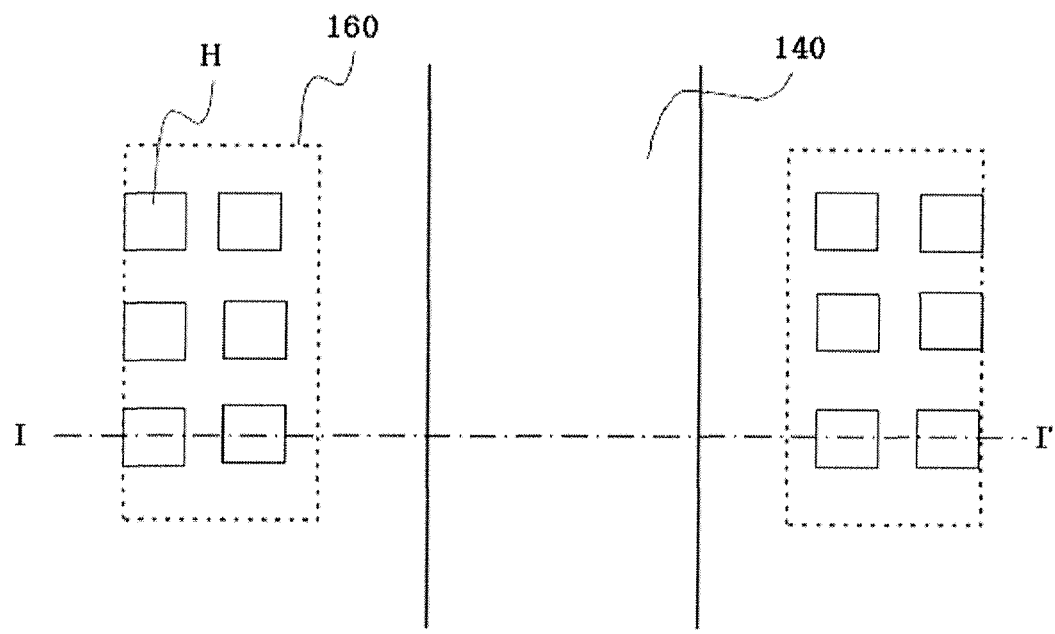
FIG. 11 is a plan view of a semiconductor device according to an embodiment.

FIG. 1 is a cross-sectional view illustrating an embodiment of a semiconductor device. FIG. 11 is a plan view illustrating an embodiment of a semiconductor device, where FIG. 1 provides the cross-section through line I-I' of FIG. 11.

A semiconductor device with air gaps can include a first interlayer dielectric (ILD) layer 120, a metal line 140, air gaps 160, an etch stop layer 150, and a second ILD layer 170. A second etch stop layer (not shown) can be formed on the etch stop layer 150 under the second ILD layer 170.

The first ILD layer 120 can be disposed on a substrate (or lower structure) 110. The first ILD layer 120 can be formed of a low k material, such as for example, boro-phospho-silicate glass (BPSG) using tetra-ethyl-ortho-silicate (TEOS)-chemical vapor deposition (CVD), plasma enhanced chemical vapor deposition (PECVD)-$SiO_2$, PECVD-SiON and TEOS, CVD-$SiO_2$ doped using silane gas ($SiH_4$), or CVD-PSG doped with phosphorus (P).

The metal line 140 is a line that can be formed by depositing a metal in a trench. The metal line 140 can be formed of at least one of copper (Cu), aluminum (Al), silver (Ag), gold (Au), and tungsten (W).

The air gaps 160 are disposed in the remaining trenches and can be formed within the first ILD layer 120 such that the air gaps are adjacent to the metal line 140.

The air gaps 160 are partially formed in the first ILD layer 120 around the metal layer 140 and reduce the dielectric constant of the first ILD layer 120.

The etch stop layer 150 includes a plurality of small holes at locations where the air gaps 160 are formed. The etch stop layer 150 can be formed on the first ILD layer 120, the metal line 140, and the air gaps 160.

In other words, since the etch stop layer 150 includes the stably fine holes on the first ILD layer 120 and the metal line 140, the air gaps 160 can be formed within the first ILD layer 120 in a stable structure.

The holes of the etch stop layer 150 can have a diameter ranging from approximately 0.16 to approximately 0.2 µm. In one embodiment, dense holes can be formed in the etch stop layer 150 by etching the etch stop layer 150 using a reactive ion etching (RIE) process.

In addition, the etch stop layer 150 can have a thickness ranging from approximately 700 Å to approximately 1,000 Å, which makes it possible to stably support the air gaps 160.

The etch stop layer 150 can be formed of, for example, SiN or SiON. In a further embodiment, a second nitride layer formed without holes can be formed on the etch stop layer 150 for additional support of subsequent layers.

The second ILD layer 170 can be formed over the resulting structure having the etch stop layer 150.

In the above-described embodiment, the semiconductor device can have the effect of having an ILD layer with a low dielectric constant, which is stable in structure in spite of the air gaps.

Further, the semiconductor device can reduce the dielectric constant (k) value by partially forming the air gaps, contributing to improving the RC delay.

An embodiment of a method for manufacturing a semiconductor device will be described below in detail.

FIGS. 2 to 10 are cross-sectional views illustrating an embodiment of a method for manufacturing a semiconductor device.

Figure 2:
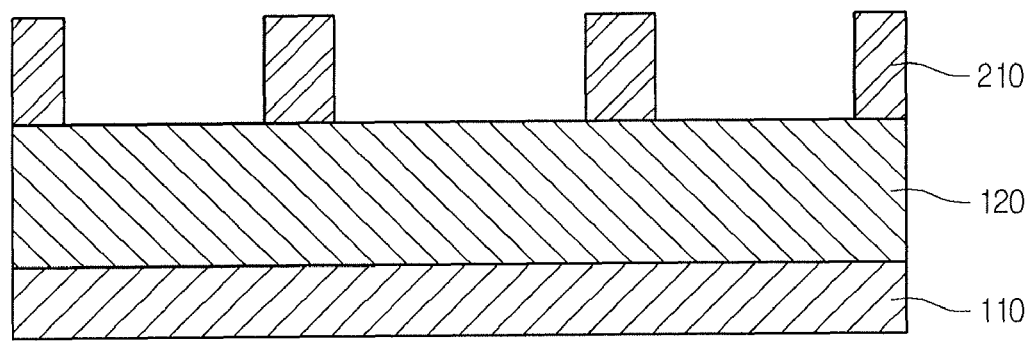
FIGS. 2 to 10 are cross-sectional views illustrating an embodiment of a method for manufacturing a semiconductor device.

Referring to FIG. 2, a first ILD layer 120 is formed on a substrate (or lower structure) 110. The first ILD layer 120 can be a low k material. The first ILD layer 120 can be formed of, for example, BPSG using TEOS-CVD, PECVD-$SiO_2$, PECVD-SiON and TEOS, CVD-$SiO_2$ doped using silane gas ($SiH_4$), or CVD-PSG doped with phosphorus (P).

A plurality of first photoresist patterns 210 for a plurality of trenches can be formed on the first ILD layer 120.

The first photoresist patterns 210 include trench patterns for the formation of metal lines, and trench patterns for the formation of air gaps.

Figure 3:
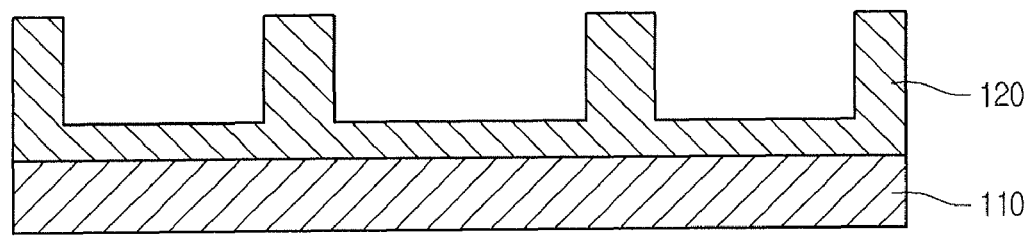

Referring to FIG. 3, the first ILD layer 120 is etched using the first photoresist patterns 210 as an etch mask to form a plurality of trenches.

Figure 4:
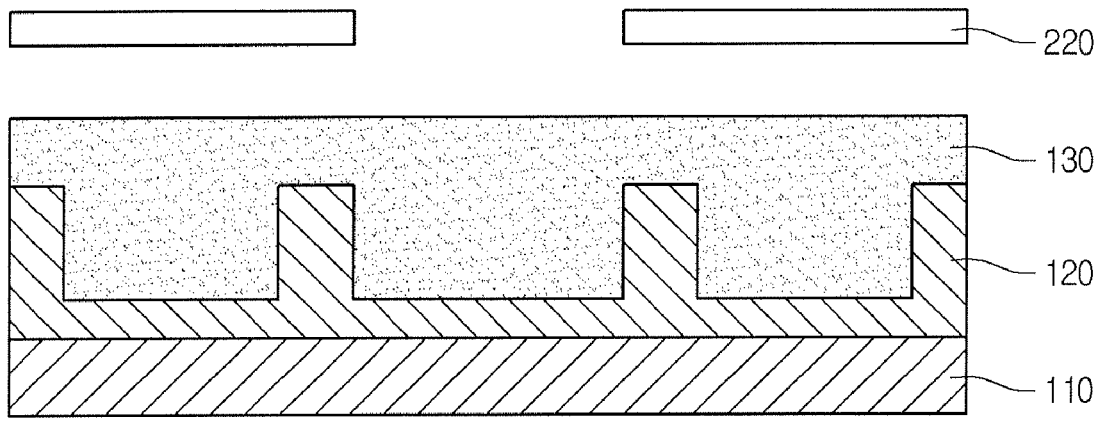

Referring to FIG. 4, a second photoresist layer 130 is deposited over the resulting structure where the trenches are formed.

Figure 5:
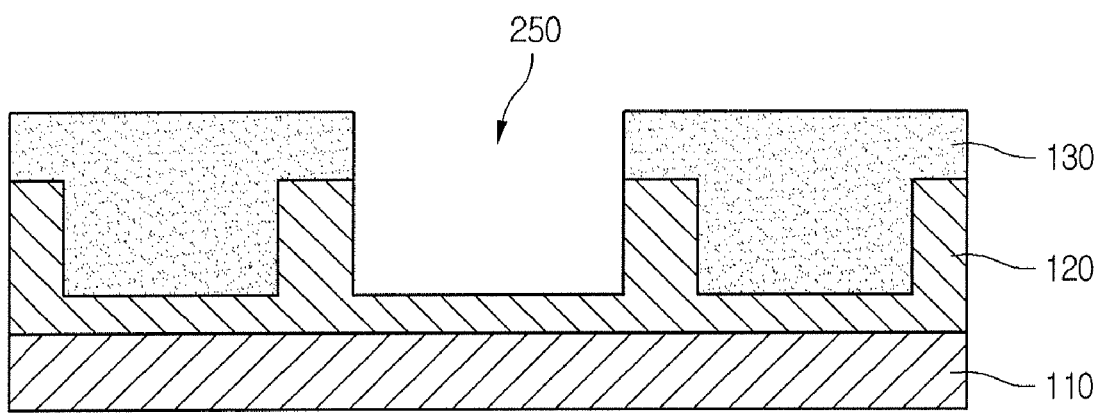

Referring to FIGS. 4 and 5, a portion of the second photoresist layer 130 in a region defined for the formation of the metal line is photo exposed using, for example, a mask 220, and is then developed to form a trench 250 for the formation of a metal line.

Figure 6:
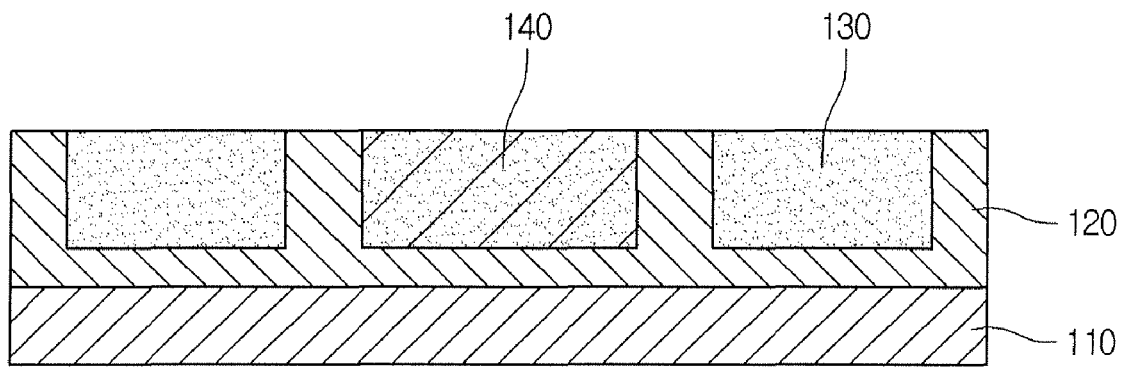

Referring to FIG. 6, a metal can be deposited in the trench 250 to form a metal line 140. The metal line 140 and the second photoresist layer 130 are planarized. The metal line 140 can be formed by depositing a metal in the trench 250. The metal line 140 can be formed of at least one of copper (Cu), aluminum (Al), silver (Ag), gold (Au), and tungsten (W).

Figure 7:
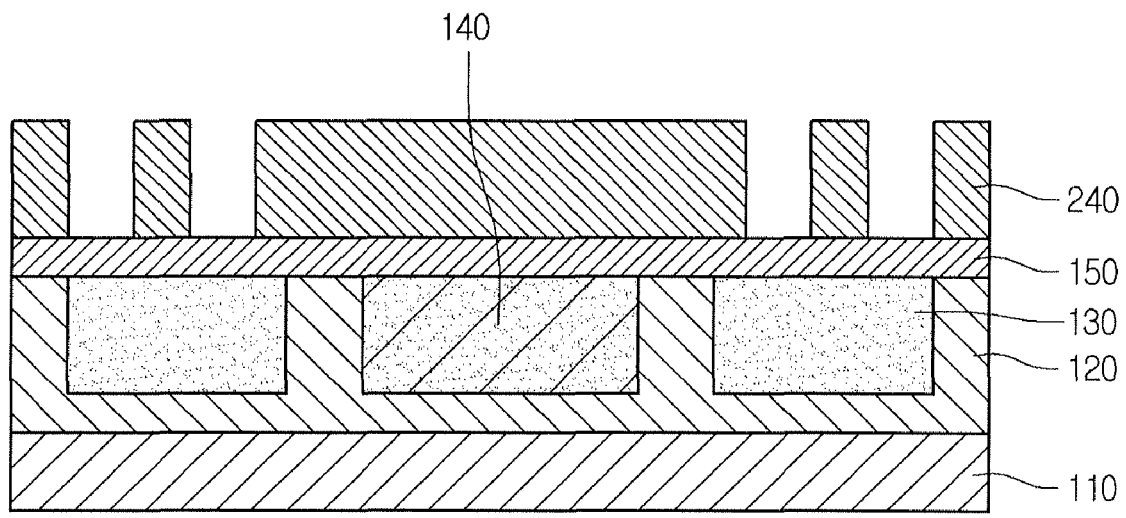

Referring to FIG. 7, an etch stop layer 150 is formed on the metal line 140 and the second photoresist layer 130. In an embodiment, the etch stop layer 150 can have a thickness ranging from approximately 700 Å to approximately 1,000 Å, making it possible to stably support air gaps 160, which will be described later.

The etch stop layer 150 can be formed of SiN or SiON.

A third photoresist pattern 240 with a plurality of small holes on regions not defined for the metal layer 140 is formed on the etch stop layer 150. In an embodiment, the small holes of the photoresist patterns 240 can have a diameter ranging from approximately 0.16 μm to approximately 0.2 μm.

Figure 8:
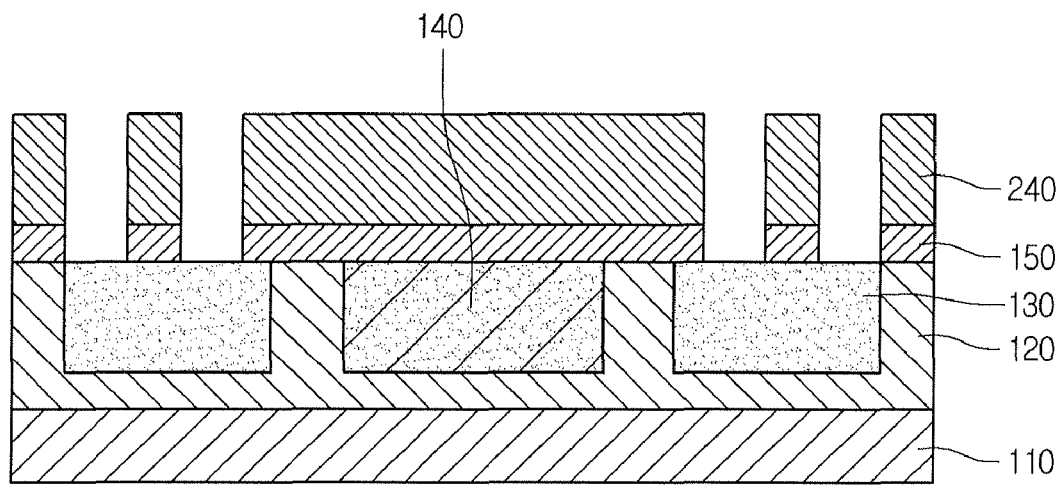

Referring to FIG. 8, the etch stop layer 150 is etched using the third photoresist pattern 240 as an etch mask to form a plurality of holes in the etch stop layer 150.

Dense holes can be formed in the etch stop layer 150 by etching the etch stop layer 150 using, for example, an RIE process.

Figure 9:
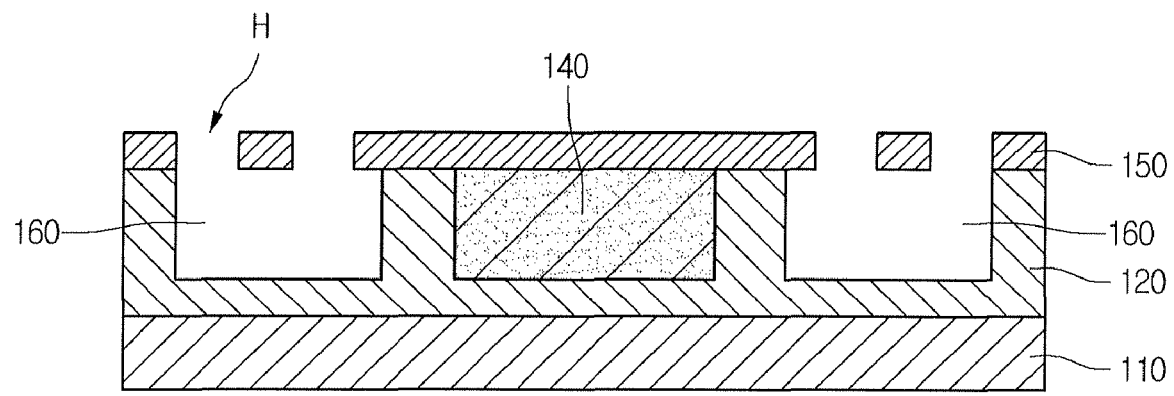

Referring to FIG. 9, the second photoresist layer 130 disposed under the etch stop layer 150 is removed by an ashing process to define air gaps 160 in the first ILD layer 120. The forming of the air gaps 160 may include supplying an ashing solution through the small holes of the etch stop layer 150. The third photoresist pattern 240 can be removed during the same process as removing the second photoresist layer 130.

Figure 10:
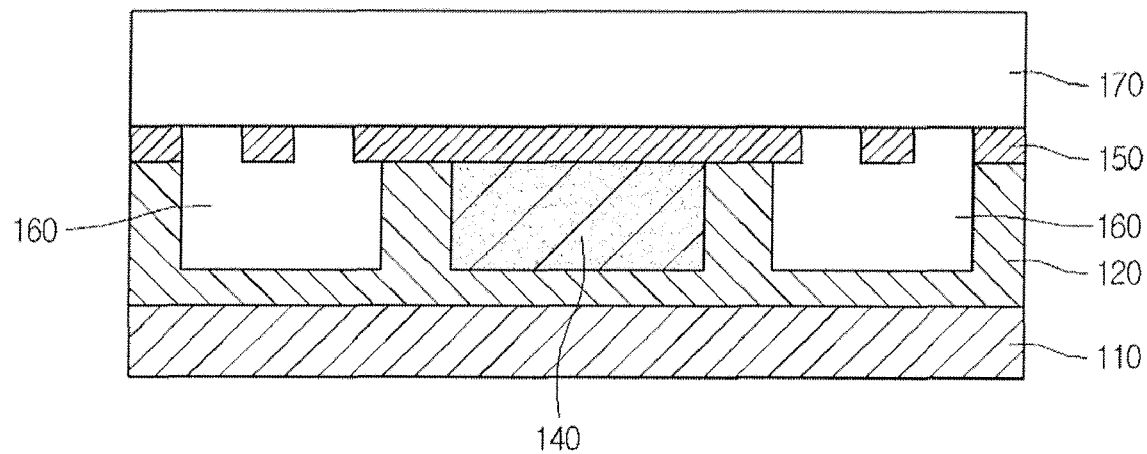

Referring to FIG. 10, a second ILD layer 170 can be formed on the resulting structure where the etch stop layer 150 is formed. In a further embodiment, a second etch stop layer formed without holes can be formed on the etch stop layer 150.

Therefore, compared with the related art ILD layer, a semiconductor device having a low dielectric constant can be manufactured by forming air gaps in the ILD layer.

In addition, the air gaps can reduce the dielectric constant of the ILD layer, contributing to reducing the RC delay.

Further, a semiconductor device having a low dielectric constant can be manufactured by forming air gaps in ILD layers.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device, comprising:

forming a first interlayer dielectric layer on a substrate;

forming at least one trench for an air gap in the first interlayer dielectric layer;

forming an etch stop layer on the first interlayer dielectric layer having the at least one trench for an air gap;

selectively etching the etch stop layer to form a plurality of holes;

forming a photoresist layer in the at least one trench for an air gap before forming the etch stop layer on the first interlayer dielectric layer; and removing the photoresist layer in the at least one trench after selectively etching the etch stop layer to form the plurality of holes, thereby forming an air gap in the first interlayer dielectric layer.

2. The method according to claim 1, further comprising:

forming a second etch stop layer having no holes formed therein on the etch stop layer.

3. The method according to claim 1, further comprising:

forming a second interlayer dielectric layer on the etch stop layer.

4. The method according to claim 1, wherein the etch stop layer comprises SiN.

5. The method according to claim 1, wherein the plurality of holes are densely formed in the etch stop layer by etching the etch stop layer using a reactive ion etching (RIE) process.

6. The method according to claim 1, wherein the holes formed in the etch stop layer have a diameter ranging from approximately 0.16 µm to approximately 0.2 µm.

7. A method for manufacturing a semiconductor device, comprising:
   forming a first interlayer dielectric layer on a substrate;
   forming at least one trench for an air gap in the first interlayer dielectric layer;
   forming an etch stop layer on the first interlayer dielectric layer having the at least one trench for an air gap;
   selectively etching the etch stop layer to form a plurality of holes;
   forming a first photoresist layer on the first interlayer dielectric layer including the at least one trench for an air gap;
   selectively removing the first photoresist layer on a trench defined for formation of a metal line; and
   forming a metal line by depositing metal in the trench defined for formation of the metal line and planarizing the metal layer and the first photoresist layer until the first interlayer dielectric layer is exposed.

8. The method according to claim 7, wherein selectively etching the etch stop layer to form a plurality of holes comprises:
   forming a second photoresist layer on the etch stop layer;
   selectively removing the second photoresist layer to expose a plurality of small regions of the etch stop layer in regions above the first photoresist layer; and
   etching the exposed regions of the etch stop layer using the second photoresist layer as an etch mask, thereby exposing the first photoresist layer through holes in the etch mask layer, the in method further comprising:
   removing the first photoresist layer formed under the etch stop layer to form an air gap in the first interlayer dielectric layer.

9. The method according to claim 8, wherein removing the first photoresist layer formed under the etch stop layer comprises supplying an ashing solution through the holes of the etch stop layer.

* * * * *